US006628137B2

United States Patent
Mori et al.

(10) Patent No.: US 6,628,137 B2
(45) Date of Patent: *Sep. 30, 2003

(54) APPARATUS AND METHOD FOR TESTING SEMICONDUCTOR INTEGRATED CIRCUIT

(75) Inventors: Hisaya Mori, Hyogo (JP); Shinji Yamada, Hyogo (JP); Teruhiko Funakura, Tokyo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/927,471

(22) Filed: Aug. 13, 2001

(65) Prior Publication Data
US 2002/0118017 A1 Aug. 29, 2002

(30) Foreign Application Priority Data
Feb. 8, 2001 (JP) ........................ 2001-032848

(51) Int. Cl.[7] .............................................. G01R 31/26
(52) U.S. Cl. ...................................................... 324/765
(58) Field of Search ................. 324/765, 719; 702/118, 120; 714/734, 736

(56) References Cited

U.S. PATENT DOCUMENTS 6,400,173 B1 * 6/2002 Shimizu et al. ............. 324/765
2001/0034865 A1 * 10/2001 Park et al. .................. 714/724

FOREIGN PATENT DOCUMENTS

| JP | 1-316024 | 12/1989 |
| JP | 8-233912 | 9/1996 |
| JP | 9-189750 | 7/1997 |

OTHER PUBLICATIONS

Co-pending Related U.S. application Ser. No. 09/904,625, filed Jul. 16, 2001 (Our Ref. No. 50090-312).

* cited by examiner

Primary Examiner—N. Le
Assistant Examiner—Amy He
(74) Attorney, Agent, or Firm—McDermott, Will & Emery

(57) ABSTRACT

There are provided a test apparatus and a test method for testing a semiconductor integrated circuit which facilitate control of a BOST device and improve the versatility of the BOST device. There is provided an interface for exchanging signals between a BOST device and an external controller. A test control signal and a test result analysis signal are exchanged by means of the interface, thus effecting a test and analysis of the test.

9 Claims, 5 Drawing Sheets

APPARATUS AND METHOD FOR TESTING SEMICONDUCTOR INTEGRATED CIRCUIT

BACKGROUND OF THE INVENTION

1. Field of the Invention

The present invention relates to an apparatus for testing a semiconductor integrated circuit, and more particularly to an apparatus and method for testing a semiconductor integrated circuit comprising an analog-to-digital converter circuit for converting an analog signal into a digital signal and a digital-to-analog converter circuit for converting a digital signal into an analog signal.

2. Background Art

Recently, in relation to a system LSI embodied in a one-chip semiconductor integrated circuit (a one-chip LSI) consisting of a plurality of functionally-systematized circuit modules or embodied in a hybrid integrated circuit (a chip set LSI), combination of digital and analog circuits (i.e., a system LSI handling a mixed signal), having high performance and precision, has been rapidly pursued. Even in relation to a test apparatus for a semiconductor integrated circuit, development of a test apparatus capable of handling a mixed signal is also pursued. Tester manufacturers have provided testers coping with a semiconductor integrated circuit using a mixed signal.

A tester compatible with a semiconductor integrated circuit using a mixed signal has a tendency to become expensive in order to comply with high performance specifications. For this reason, moves are afoot to recycle an existing low-speed, low-precision tester which has been used for, e.g., a logic LSI, to thereby avoid a hike in the price of a tester.

A big problem with such a test apparatus lies in a characteristic test for a D/A converter circuit for converting a digital signal into an analog signal (digital-to-analog converter, hereinafter called a "DAC") as well as in a characteristic test for an A/D converter circuit for converting an analog signal into a digital signal (hereinafter called an "ADC"). In association with an increase in the precision of the characteristic test, embodiment of a low-cost test apparatus compatible with a semiconductor integrated circuit including the DAC and ADC has posed a challenge.

In a testing environment of a general tester, connection jigs for connecting a tester with a DUT (device under test), such as a plurality of DUT circuit boards (simply called "DUT boards") and cables, are provided at a plurality of points along a measurement path extending from measurement equipment provided in the tester to a semiconductor integrated circuit (hereinafter called a "DUT"). Further, the measurement path is long and accounts for occurrence of noise and a drop in measurement accuracy. Further, simultaneous testing of a plurality of DUTs is also impossible. A limitation is imposed on the speed of a low-speed tester, and hence the low-speed tester cannot conduct a test at a real operating speed, thereby posing a fear of an increase in a time required for conducting mass-production testing of a system LSI.

Japanese Patent Application Laid-Open No. 316024/1989 describes a tester. The tester is equipped with a memory device for storing conversion data at an address designated by input data which have been entered into a DAC of a test circuit. An analog signal which has been subjected to digital-to-analog conversion is input to an ADC, and an output from the ADC is sequentially stored in the memory device. After conversion of all the input data sets has been completed, the conversion data stored in the memory device are sequentially delivered to a tester. The tester sequentially compares the input data with the conversion data, thus producing a test conclusion.

However, the tester must supply data to be input to the DAC, an address to be used for storing conversion data into a memory device, and a control signal. Moreover, data stored in the memory device must be supplied to the tester. Further, there is the probability that noise arising in a long measurement path extending from the tester to a DUT may deteriorate precision of measurement. Further, the majority of pin electronics provided on the tester are occupied for testing a single DUT, thereby posing a difficulty in simultaneous measurement of a plurality of DUTs.

Further, communication for transmitting conversion data to the tester is time consuming, and test conclusions are produced after completion of all tests. Hence, shortening of a test time is also difficult.

SUMMARY OF THE INVENTION

The present invention has been conceived to solve such a problem and is aimed at providing an apparatus of testing a semiconductor integrated circuit, which apparatus facilitates control of a BOST device and improve the versatility thereof.

According to one aspect of the present invention, an apparatus for testing a semiconductor integrated circuit is provided for testing a semiconductor integrated circuit which includes an analog-to-digital converter circuit for converting an analog signal into a digital signal and a digital-to-analog converter circuit for converting a digital signal into an analog signal. The apparatus for testing comprises a test circuit board for testing the semiconductor integrated circuit, by means of exchanging signals with the semiconductor integrated circuit. Further the apparatus comprises a test ancillary device which is disposed in the vicinity of the test circuit board and is connected to the test circuit board, and an external controller which is connected to the test ancillary device and has a CPU. The test ancillary device comprises an interface for exchanging a signal with the CPU of the external controller. Further the test ancillary device comprises a data circuit which produces a digital test signal on the basis of a signal output from the CPU by way of the interface and supplies the digital test signal to the digital-to-analog converter circuit of the semiconductor integrated circuit. Further the test ancillary device comprises a digital-to-analog converter circuit for test purpose which converts the digital test signal output from the data circuit into an analog test signal and supplies the analog test signal to the analog-to-digital converter circuit of the semiconductor integrated circuit. Further the test ancillary device comprises an analog-to-digital converter circuit for test purpose which converts, into a digital test output, an analog test output from the digital-to-analog converter circuit of the semiconductor integrated circuit. Further the test ancillary device comprises measured data memory for storing a digital test output from the analog-to-digital converter circuit of the semiconductor integrated circuit and a digital test output from the analog-to-digital converter circuit for test purpose. Further the test ancillary device comprises an analysis section for analyzing the digital test outputs stored in the measured data memory in response to a control signal output from the CPU of the external controller, and supplying the result of the analysis to the external controller by way of the interface.

According to another aspect of the present invention, an apparatus for testing a semiconductor integrated circuit is provided for testing a semiconductor integrated circuit which includes an analog-to-digital converter circuit for converting an analog signal into a digital signal and a digital-to-analog converter circuit for converting a digital signal into an analog signal. The apparatus for testing comprises a test circuit board for testing the semiconductor integrated circuit, by means of exchanging signals with the semiconductor integrated circuit. Further the apparatus comprises a test ancillary device which is disposed in the vicinity of the test circuit board and is connected to the test circuit board. Further the apparatus comprises an external controller which is connected to the test ancillary device and produces and outputs a signal waveform from a clock signal and a test pattern signal in accordance with a test program. The test ancillary device comprises an interface for exchanging a signal with the external controller. Further the test ancillary device comprises a data circuit which produces a digital test signal on the basis of the signal waveform output received by way of the interface and supplies the digital test signal to the digital-to-analog converter circuit of the semiconductor integrated circuit. Further the test ancillary device comprises a digital-to-analog converter circuit for test purpose which converts the digital test signal output from the data circuit into an analog test signal and supplies the analog test signal to the analog-to-digital converter circuit of the semiconductor integrated circuit. Further the test ancillary device comprises an analog-to-digital converter circuit for test purpose which converts, into a digital test output, an analog test output from the digital-to-analog converter circuit of the semiconductor integrated circuit. Further the test ancillary device comprises measured data memory for storing a digital test output from the analog-to-digital converter circuit of the semiconductor integrated circuit and a digital test output from the analog-to-digital converter circuit for test purpose. Further the test ancillary device comprises an analysis section for analyzing the digital test outputs stored in the measured data memory, and supplying the result of the analysis to the external controller by way of the interface. The external controller renders a determination on the result of the analysis.

According to another aspect of the present invention, an apparatus for testing a semiconductor integrated circuit is provided for testing a semiconductor integrated circuit which includes an analog-to-digital converter circuit for converting an analog signal into a digital signal and a digital-to-analog converter circuit for converting a digital signal into an analog signal. The apparatus for testing comprises a test circuit board for testing the semiconductor integrated circuit, by means of exchanging signals with the semiconductor integrated circuit. Further the apparatus comprises a test ancillary device which is disposed in the vicinity of the test circuit board and is connected to the test circuit board, and an external controller which is connected to the test ancillary device. The test ancillary device comprises a communications scheme conversion module which can communicate with the external controller by means of a plurality of communications schemes and converts the communications schemes into a custom-made bus scheme in the test ancillary device. Further the ancillary device comprises a data circuit which produces a digital test signal and supplies the digital test signal to the digital-to-analog converter circuit of the semiconductor integrated circuit. Further the ancillary device comprises a digital-to-analog converter circuit for test purpose which converts the digital test signal output from the data circuit into an analog test signal and supplies the analog test signal to the analog-to-digital converter circuit of the semiconductor integrated circuit. Further the ancillary device comprises an analog-to-digital converter circuit for test purpose which converts, into a digital test output, an analog test output from the digital-to-analog converter circuit of the semiconductor integrated circuit. Further the ancillary device comprises measured data memory for storing a digital test output from the analog-to-digital converter circuit of the semiconductor integrated circuit and a digital test output from the analog-to-digital converter circuit for test purpose. Further the ancillary device comprises an analysis section for analyzing the digital test outputs stored in the measured data memory, and supplying the result of the analysis to the external controller.

Other and further objects, features and advantages of the invention will appear more fully from the following description.

DETAILED DESCRIPTION OF THE PREFERRED EMBODIMENTS

To solve the problems set forth, improved test apparatus capable of effecting high-speed, high-precision measurement at low cost have also been put forward.

The thus-proposed test apparatus will now be described in detail.

Figure 4:
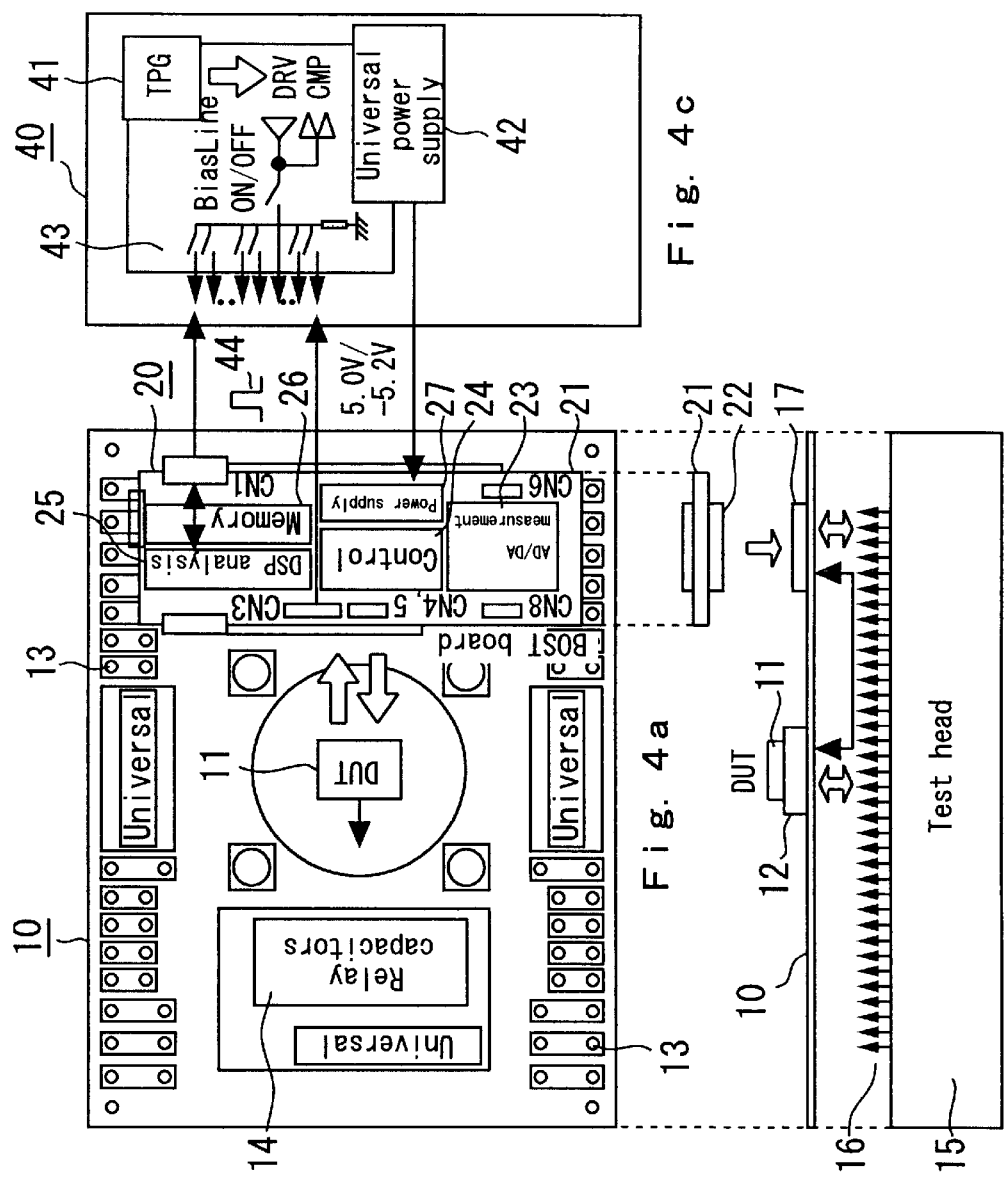
FIGS. 4a through 4c are schematic diagrams showing the configuration of an improved test apparatus for testing a semiconductor integrated circuit.

FIGS. 4a through 4c are schematic diagrams showing the configuration of an improved test apparatus for testing a semiconductor integrated circuit. FIG. 4a is a top view of a DUT board: FIG. 4b is a side view of the DUT board: and FIG. 4c is a schematic diagram showing the configuration of a test machine (tester).

The improved tester comprises a DUT board 10; a test ancillary device [also called a BOST (built-off self-test) device]] 20; and a tester 40.

The DUT board 10 is for testing a molded IC designated by a DUT 11. A molded IC is a semiconductor integrated circuit (IC) chip which is coated with mold resin such that a plurality of terminals are led outside from the mold resin. The IC chip mounted on the DUT 11 is, for example, a one-chip system LSI of mixed signal type. A DAC for converting a digital signal into an analog signal and an ADC for converting an analog signal into a digital signal are provided within a single chip. A hybrid integrated circuit (IC) of mixed signal type comprising a plurality of chips mounted on a common circuit board may be employed as the DUT 11.

The DUT board 10 has a DUT socket 12 for receiving terminals of the DUT 11. A plurality of connection terminals 13 and a cluster of relay capacitors 14 for test purposes are provided around the DUT socket 12.

As shown in FIG. 4b, a test head 15 is located below the DUT board 10. The test head 15 has a plurality of connection pins 16 to be connected to the DUT board 10. Signals required for a test are exchanged with the DUT 11 by way of the connection pins 16.

A BOST device 20 is provided in the vicinity of the DUT board 10. In the example of the circuit shown in FIG. 4, the BOST device 20 is constituted on a test ancillary board (BOST board) 21. The BOST board 21 is to be mounted on the DUT board 10. A socket 17 is provided on the DUT board 10 for receiving the BOST board 21. A connector 22 to be fitted to the socket 17 is provided on a lower surface of the BOST board 21, and the connector 22 is fitted to the socket 17. As a result, the BOST board 21 is supported on the DUT board 10, so that signals are exchanged with the test head 15 by way of the socket 17.

As has been known well, the BOST board 21 is an external test ancillary device (built-off self-test device) for assisting a test circuit which causes a DUT to perform a built-in-self-test therein without having dependence on the tester 40. The BOST board 21 has an AD/DA measurement section 23, a control section 24, a DSP analysis section 25, a memory section 26, and a power supply section 27.

The tester 40 has a test pattern generator (hereinafter simply called a "TPG") 41, a power supply section 42, and a pin electronic section 43. The tester 40 supplies a supply voltage Vd to the BOST board 21, thus exchanging control signals 44 with the BOST board 21. The control signals 44 include a test analysis result signal sent from the BOST board 21 to the tester 40 as well as instruction signals sent from the tester 40 to the BOST board 21 and to the DUT board 10.

The control signals 44, which include a number code (a test analysis number code) and are output from the tester 40 to the BOST board 21, are produced as test pattern signals by the TPG 41 built in the tester 40 in compliance with test signal requirements described in a test program, as in the case of a test conducted on another DUT 11. The control signals 44 are supplied to the BOST board 21 and the DUT board 10, by way of the pin electronic section 43 of the tester 40 having a plurality of signal I/O pins. A test analysis result (pass/fail information) output from the BOST board 21 is delivered to the pin electronic section 43 of the tester 40. A determination section of the pin electronic section 43 acquires information about the test analysis result in comparison with a test pattern signal and through analysis of a comparison result.

Figure 5:
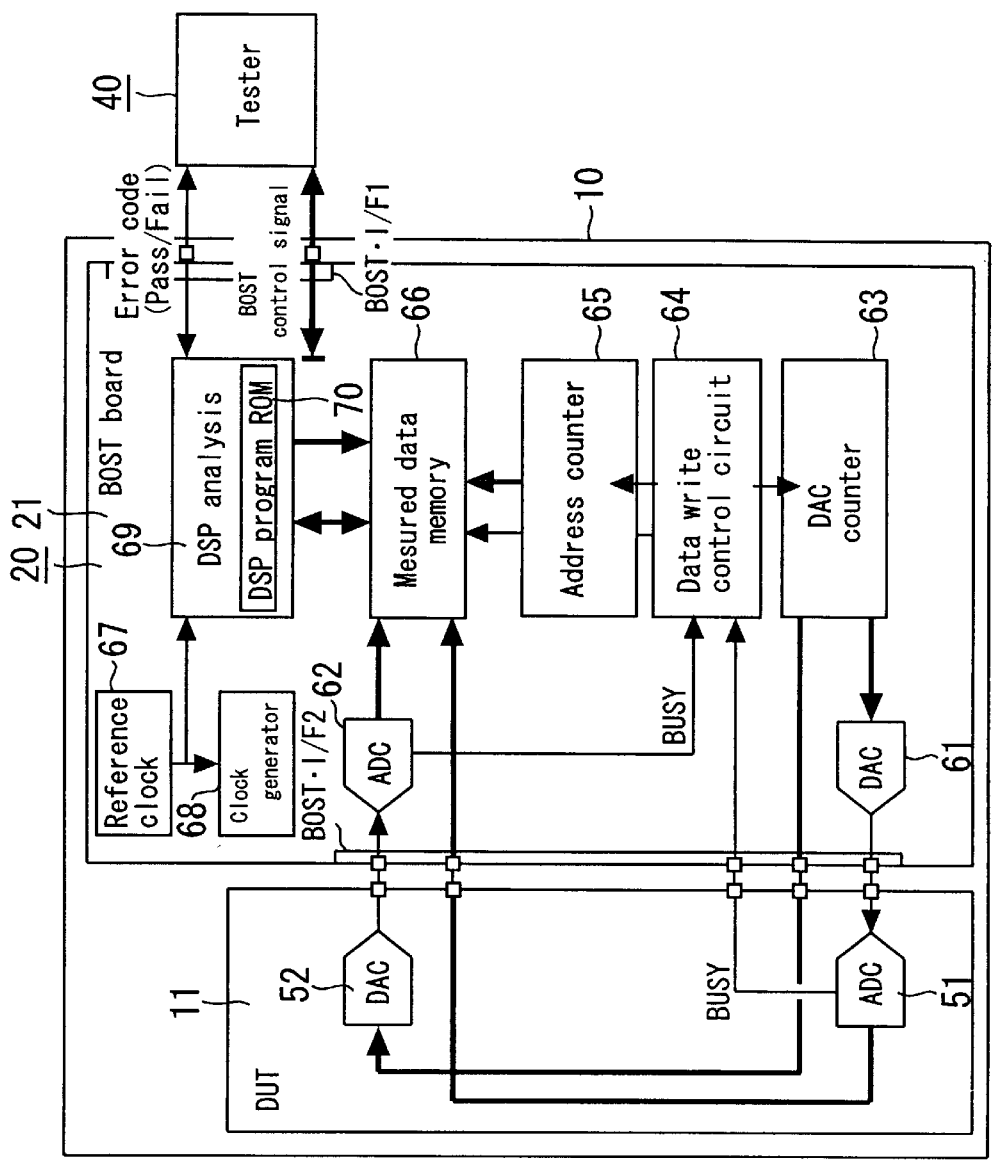
FIG. 5 is a block diagram showing the configuration of an electric circuit provided in the test apparatus shown in FIGS. 4a through 4c.

FIG. 5 is a block diagram showing the configuration of an electric circuit provided in the test apparatus shown in FIGS. 4a through 4c.

The DUT 11 comprises an ADC 51 for converting an analog signal into a digital signal, and a DAC 52 for converting a digital signal into an analog signal.

The BOST board 21 has a DAC 61 for test purpose which supplies an analog test signal to the ADC 51 of the DUT 11, and an ADC 62 for test purpose which converts an analog test output produced by the DAC 52 of the DUT 11 into a digital test output. Moreover, the BOST board 21 comprises a DAC input data circuit (DAC counter) 63; a data write control circuit 64; a measured data memory address counter 65; measured data memory 66; a reference clock signal circuit 67; a clock signal generator circuit 68; and a DSP analysis section 69. The DSP analysis section 69 has DSP program ROM 70.

The DAC 61, the ADC 62, the DAC input data circuit 63, the data write control circuit 64, and the measured data memory address counter 65 are included in the AD/DA measurement section 23 shown in FIGS. 4a through 4c. The measured data memory 66 is included in the memory section 26, and the DSP analysis section 69 is included in the DSP analysis section 25.

By means of such a configuration, a digital test signal (i.e., test data) is stored in the DAC input data circuit 63. In accordance with an instruction from the tester 40, the test data are supplied from the DAC input data circuit 63 to the DAC 52 of the DUT 11 and to the DAC 61 of the BOST board 21.

The test data supplied to the DAC 61 are converted into an analog test signal, and the analog test signal is supplied to the ADC 51. The ADC 51 converts the analog test signal into a digital test output, and the digital test output is supplied to the measured data memory 66.

Meanwhile, the test data which have been supplied directly to the DAC 52 of the DUT 11 from the DAC input data circuit 63 are converted into an analog test output by the DAC 52. The analog test output is converted into a digital test output by means of the ADC 62 of the BOST board 21. The digital test output is supplied to the measured data memory 66.

The measured data memory 66 sequentially stores to predetermined addresses the digital test output supplied from the ADC 51 of the DUT 11, and the digital test output supplied from the DAC 52 by way of the ADC 62.

The ADC 51 of the DUT 11 and the ADC 62 of the BOST board 21 convert an analog signal into a digital signal, sequentially. Every time a single digital signal is output, the ADC 51 and the ADC 62 each output a BUSY signal. The BUSY signals are supplied to the data write control circuit 64 provided on the BOST board 21. On the basis of the thus-supplied BUSY signals, the data write control circuit 64 sequentially advances the digital test data pertaining to the DAC input data circuit 63 to the next digital test data on a per-data-set basis. Further, the data write control circuit 64 acts on the measured data memory address counter 6 5so as to sequentially advance an address of the measured data memory 66.

As mentioned above, a code of the digital test data to be converted by the DUT 11 is advanced by the DAC input data circuit 63. As a result of sequential advancement of an address on the measured data memory 66 at which the digital test output converted by the DUT 11 is to be stored, the ADC 51 and the DAC 52 provided in the DUT 11 sequentially pursue conversion required by a test. The thus-converted measured data are sequentially stored in the measured data memory 66. In subsequent processes, conversion tests proceed until a final code set by the DSP analysis section 69 on the BOST board 21 is achieved, and the results of all conversion tests are stored in the measured data memory 66.

After the ADC 51 and the DAC 52 of the DUT 11 have completed conversion tests, the DSP analysis section 69 provided on the BOST board 21 sequentially reads conversion data stored in the measured data memory 66, through use of a program stored in the DSP program ROM 70, thus analyzing a conversion characteristic. The analysis includes computation of an A/D conversion characteristic parameter, a D/A conversion characteristic parameter, a differential linearity, and an integral linearity error. An analysis result (pass/fail information) is sent from the BOST board 21 to the tester 40, wherein the tester 40 processes a test result.

In the configuration shown in FIGS. 4a through 4c, the BOST board 21 is provided in the vicinity of the DUT board 10 and has the function of causing the ADC 51 and DAC 52 of the DUT 11 to perform conversion tests. The conversion tests can be effected on the BOST board 21.

Consequently, an analog measurement system line provided between the DUT board 10 and the BOST board 21 can be shortened, and occurrence of a measurement error attributable to noise can be suppressed sufficiently. Thus, a high-precision test can be implemented, and a test can be carried out at a higher speed on the basis of a signal exchanged between the DUT board 10 and the BOST board 21 located in the vicinity thereof.

An analog measurement system line can be obviated from an area between the BOST board 21 and the tester 40, thereby increasing the accuracy of a test. After required conversion tests have been completed on the BOST board 21, the results of conversion tests are sent to the tester 40. Thus, a test speed can be increased as compared with a case in which converted data are transmitted to the tester 40.

In the apparatus shown in FIGS. 4a through 4c, the conversion test function of the ADC 51 and that of the DAC 52 of the DUT 11 are implemented on the BOST board 21. Hence, there is no necessity of adding a powerful conversion test function to the tester 40. Hence, an increase in the cost of the tester 40 is prevented, thereby enabling diversion of a conventional low-speed tester to the test apparatus. When a tester 40 having a special measurement function is to be manufactured, limitations are imposed on expansion of capabilities of hardware configuration of a tester. Further, manufacture of such a tester 40 involves modifications to the tester itself, posing a fear of a hike in development costs.

The test apparatus shown in FIGS. 4a through 4c utilizes as standard equipment a TPG and pin electronics provided on a common tester. Configuration and control of a BOST board can be effected without being influenced by specifications of testers or restrictions. Thus, application of the test apparatus to various types of testers is feasible.

An improved tester has the foregoing configuration and enables high-speed, high-precision measurement. However, the tester is deficient in ease of control and versatility of a BOST device.

First Embodiment

A first embodiment of the present invention will now be described by reference to a drawing.

Figure 1:
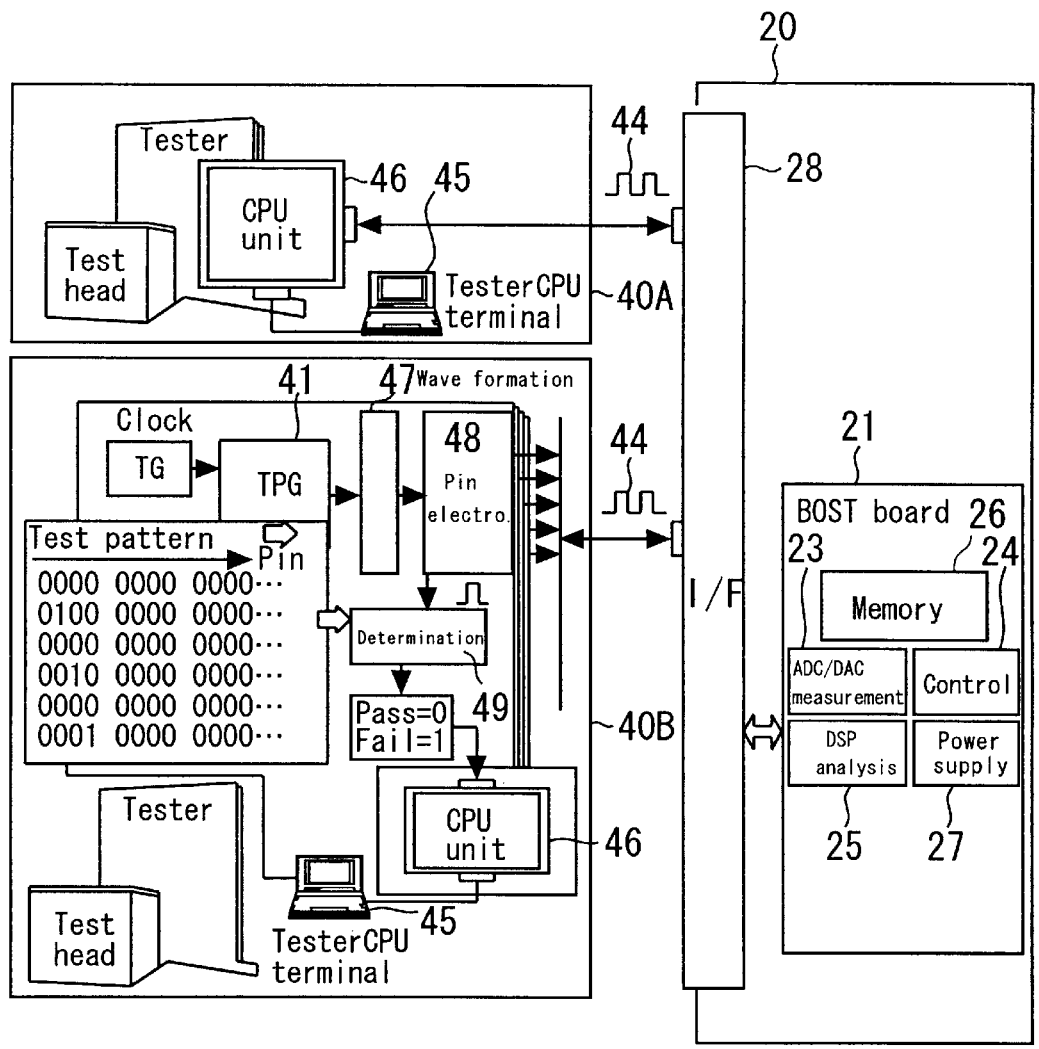
FIG. 1 is a schematic diagram showing the configuration of a test apparatus and a test method according to the first embodiment.

FIG. 1 is a schematic diagram showing the configuration of a test apparatus and a test method according to the first embodiment. In the drawing, reference numeral 20 designates a BOST device identical with that mentioned previously; 21 designates a BOST board identical with that mentioned previously; and 28 designates an interface with a controller of the BOST device 20.

Reference numerals 40A and 40B designate testers which act as external controllers in connection with the BOST device 20. Either of the testers 40A and 40B is connected to an interface 28.

First, an explanation is given of a case where the tester 40A is connected to the interface 28. A CPU unit 46 is activated by operation of a tester CPU control terminal 45, thus generating a control signal 44 for test purpose. The control signal 44 is supplied to the BOST device 20 by way of the interface 28. A test analysis result signal output from the BOST device 20 is grabbed into the tester 40A while being included in the control signal 44. These operations are the same as those mentioned previously.

According to this control method using the tester 40A, the tester 40A and the BOST device 20 can be controlled through use of a single controller. Hence, the BOST device 20 can be handled as if a tester were controlled, thereby achieving commonality of control.

In a case where the tester 40B is connected to the interface 28, as a result of operation of the tester CPU control terminal 45, a waveform formation section 47 forms a signal waveform from a clock signal output from a timing generator (TG) usually provided in a tester and from a tester pattern signal output from the TPG section 41, under control of a test program. A pin electronic section 48 sets the voltage of the signal waveform, and the signal waveform is output to the BOST device 20 as a control signal 44.

In connection with determination of a standard or an analysis result (Pass/Fail=0/1 information) output from the BOST device 20, a determination section 49 renders a determination on the basis of a test pattern (a determination pattern) output from the TPG section 41 and a strobe signal which is output from the TG section and represents a determination timing, as if an ordinary DUT data output were determined. The 0/1 information is grabbed into a tester CPU 46, thereby processing a result. According to the method using the tester 40B, functions provided in a tester as standard functions are used, and hence application of the BOST device to testers of different types is facilitated.

Second Embodiment

A second embodiment of the present invention will now be described by reference to drawings.

Figure 2:
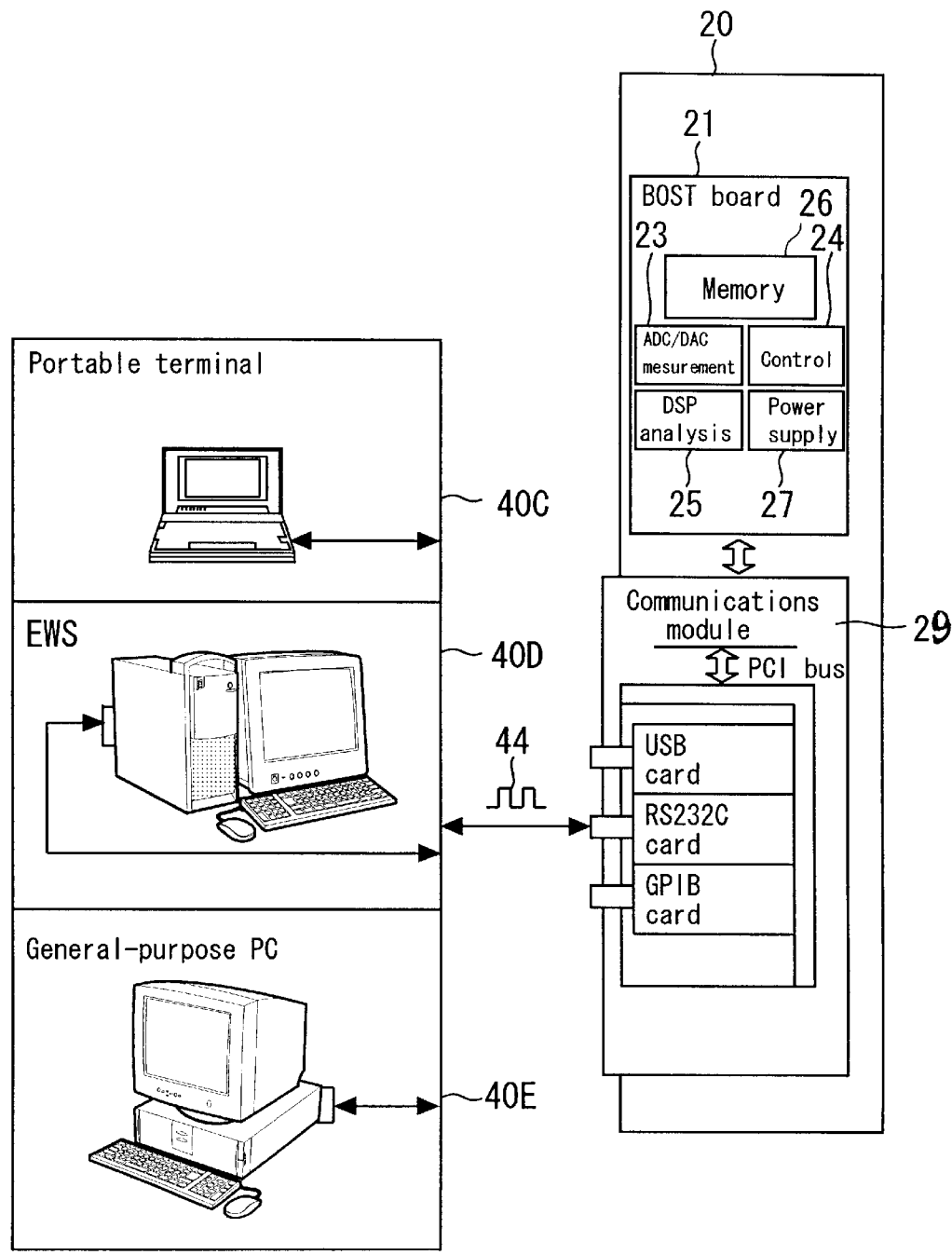
FIG. 2 is a schematic diagram showing the configuration of a test apparatus and a test method according to the second embodiment.

FIG. 2 is a schematic diagram showing the configuration of a test apparatus and a test method according to the second embodiment. In the present embodiment, a portable terminal 40C such as a personal digital assist (PDA), an EWS (engineering workstation) 40D, or a general-purpose PC (personal computer) 40E is employed as a controller for the BOST device 20. A general communications scheme, such as a USB (universal serial bus), RS232C, IEEE1394, GPIB, or LAN (local area network), is used for establishing communication between the controller and the BOST device 20. Interfaces complying with respective communications schemes are provided in the BOST device. One or a plurality of slots which enable(s) sharing of a plurality of communications interface cards are provided. Further, the BOST device 20 is provided with a communications scheme conversion module 29 for converting communications schemes into a communications scheme complying with a custom-designed bus of the BOST device 20.

The present embodiment shows a communications scheme conversion method embodied in a well-known PCI-bus-compatible PC card generally employed for a PC as the interface card and as the communications scheme conversion module.

Measured data are grabbed into a PC by means of communication schemes of various types. The measured data can be processed or plotted by means of commercially-available software. Thus, a result of measurement can be quantitatively evaluated. Hence, application of the BOST device 20 to an LSI design evaluation analysis tool can be effected inexpensively.

Since the BOST device can be controlled by means of a plurality of communications schemes, the versatility of the BOST device is improved. For example, design evaluation and mass-production tests can be effected by means of a common system called a BOST device. A convenience of feedback to design quality is also improved.

Third Embodiment

A third embodiment of the present invention will be described by reference to drawings.

Figure 3:
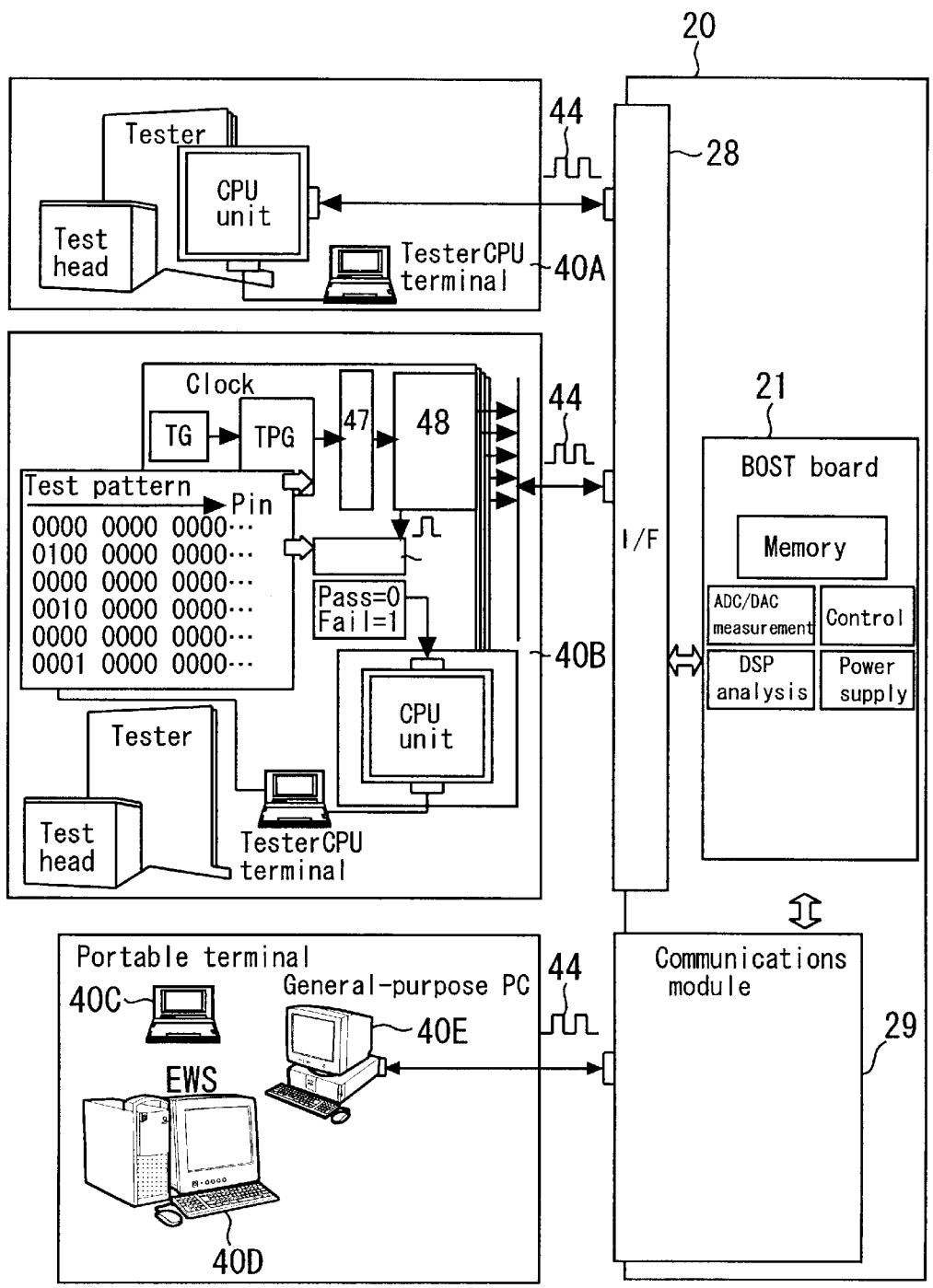
FIG. 3 is a schematic diagram showing the configuration of a test apparatus and a test method according to the third embodiment.

FIG. 3 is a schematic diagram showing the configuration of a test apparatus and a test method according to the third embodiment. As is obvious from the drawing, the third embodiment is a combination of the first and second embodiments. The BOST device 20 is equipped with the interface 28 assigned to the controllers 40A and 40B and the communications scheme conversion module 29 assigned to the controllers 40C, 40D, and 40E. Thus, the BOST device 20 can be controlled by means of any one of the controllers 40A through 40E.

Hence, application of the BOST device to testers of various types is facilitated. Further, a BOST device can be controlled by means of a plurality of communications schemes, thus improving the versatility and convenience of the BOST device.

The features and advantages of the present invention may be summarized as follows.

In the test apparatus and the test method according to the present invention, an interface is provided for exchanging signals between a BOST device and a CPU of an external controller. A test control signal and a test analysis result signal are exchanged by way of this interface. Since functions provided in a test as standard functions are used, application of the BOST device to a plurality of testers is facilitated.

In the test apparatus and the test method according to the present invention, the BOST device is provided with a communications scheme conversion module. Since the BOST device can be controlled by means of a plurality of communications schemes, the versatility and convenience of the BOST device are improved.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-032848, filed on Feb. 8, 2001 including specification, claims, drawings and summary, on which the Convention priority of the present application is based, are incorporated herein by reference in its entirety.

What is claimed is:

1. An apparatus for testing a semiconductor integrated circuit, the semiconductor integrated circuit including an analog-to-digital converter circuit for converting an analog signal into a digital signal and a digital-to-analog converter circuit for converting a digital signal into an analog signal, the apparatus comprising:

a test circuit board for testing the semiconductor integrated circuit, by means of exchanging signals with the semiconductor integrated circuit;

a test ancillary device which is disposed in the vicinity of the test circuit board and is connected to the test circuit board; and an external controller which is connected to the test ancillary device and has a CPU;

wherein the test ancillary device comprises an interface for exchanging a signal with the CPU of the external controller;

a data circuit which produces a digital test signal on the basis of a signal output from the CPU byway of the interface and supplies the digital test signal to the digital-to-analog converter circuit of the semiconductor integrated circuit;

a digital-to-analog converter circuit for test purpose which converts the digital test signal output from the data circuit into an analog test signal and supplies the analog test signal to the analog-to-digital converter circuit of the semiconductor integrated circuit;

an analog-to-digital converter circuit for test purpose which converts, into a digital test output, an analog test output from the digital-to-analog converter circuit of the semiconductor integrated circuit;

measured data memory for storing a digital test output from the analog-to-digital converter circuit of the semiconductor integrated circuit and a digital test output from the analog-to-digital converter circuit for test purpose; and an analysis section for analyzing the digital test outputs stored in the measured data memory in response to a control signal output from the CPU of the external controller, and supplying the result of the analysis to the external controller by way of the interface.

2. The test apparatus for testing a semiconductor integrated circuit according to claim 1, wherein the external controller is a tester.

3. A method for testing a semiconductor integrated circuit through use of the test apparatus defined in claim 1.

4. An apparatus for testing a semiconductor integrated circuit, the semiconductor integrated circuit including an analog-to-digital converter circuit for converting an analog signal into a digital signal and a digital-to-analog converter circuit for converting a digital signal into an analog signal, the apparatus comprising:

a test circuit board for testing the semiconductor integrated circuit, by means of exchanging signals with the semiconductor integrated circuit;

a test ancillary device which is disposed in the vicinity of the test circuit board and is connected to the test circuit board; and an external controller which is connected to the test ancillary device and produces and outputs a signal waveform from a clock signal and a test pattern signal in accordance with a test program;

wherein the test ancillary device comprises an interface for exchanging a signal with the external controller;

a data circuit which produces a digital test signal on the basis of the signal waveform output received by way of the interface and supplies the digital test signal to the digital-to-analog converter circuit of the semiconductor integrated circuit;

a digital-to-analog converter circuit for test purpose which converts the digital test signal output from the data circuit into an analog test signal and supplies the analog test signal to the analog-to-digital converter circuit of the semiconductor integrated circuit;

an analog-to-digital converter circuit for test purpose which converts, into a digital test output, an analog test output from the digital-to-analog converter circuit of the semiconductor integrated circuit;

measured data memory for storing a digital test output from the analog-to-digital converter circuit of the semiconductor integrated circuit and a digital test output from the analog-to-digital converter circuit for test purpose; and an analysis section for analyzing the digital test outputs stored in the measured data memory, and supplying the result of the analysis to the external controller by way of the interface;

wherein the external controller renders a determination on the result of the analysis.

5. The test apparatus for testing a semiconductor integrated circuit according to claim 4, wherein the external controller is a tester.

6. A method for testing a semiconductor integrated circuit through use of the test apparatus defined in claim 4.

7. An apparatus for testing a semiconductor integrated circuit, the semiconductor integrated circuit including an analog-to-digital converter circuit for converting an analog signal into a digital signal and a digital-to-analog converter circuit for converting a digital signal into an analog signal, the apparatus comprising:

a test circuit board for testing the semiconductor integrated circuit, by means of exchanging signals with the semiconductor integrated circuit;

a test ancillary device which is disposed in the vicinity of the test circuit board and is connected to the test circuit board; and an external controller which is connected to the test ancillary device;

wherein the test ancillary device comprises a communications scheme conversion module which can communicate with the external controller by means of a plurality of communications schemes and converts the communications schemes into a custom-made bus scheme in the test ancillary device;

a data circuit which produces a digital test signal and supplies the digital test signal to the digital-to-analog converter circuit of the semiconductor integrated circuit;

a digital-to-analog converter circuit for test purpose which converts the digital test signal output from the data circuit into an analog test signal and supplies the analog test signal to the analog-to-digital converter circuit of the semiconductor integrated circuit;

an analog-to-digital converter circuit for test purpose which converts, into a digital test output, an analog test output from the digital-to-analog converter circuit of the semiconductor integrated circuit;

measured data memory for storing a digital test output from the analog-to-digital converter circuit of the semiconductor integrated circuit and a digital test output from the analog-to-digital converter circuit for test purpose; and an analysis section for analyzing the digital test outputs stored in the measured data memory, and supplying the result of the analysis to the external controller.

8. The test apparatus for testing a semiconductor integrated circuit according to claim 7, wherein the external controller is a portable terminal, such as a PDA, a general-purpose PC, or an EWS.

9. A method for testing a semiconductor integrated circuit through use of the test apparatus defined in claim 7.

\* \* \* \* \*